United States Patent
Kuo et al.

(10) Patent No.: US 8,956,931 B2
(45) Date of Patent: Feb. 17, 2015

(54) METHOD FOR FABRICATING A MULTI-GATE DEVICE

(71) Applicant: Taiwan Semiconductor Manufacturing Company, Ltd., Hsin-Chu (TW)

(72) Inventors: Chih-Wei Kuo, Tainan (TW);
Yuan-Shun Chao, Zhubei (TW);
Hou-Yu Chen, Zhubei (TW);
Shyh-Horng Yang, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 13/773,515

(22) Filed: Feb. 21, 2013

(65) Prior Publication Data
US 2014/0231924 A1    Aug. 21, 2014

(51) Int. Cl.
*H01L 29/165*    (2006.01)
*H01L 29/78*    (2006.01)
*H01L 29/66*    (2006.01)

(52) U.S. Cl.
CPC ........ *H01L 29/785* (2013.01); *H01L 29/66795* (2013.01)
USPC ..... 438/157; 438/176; 438/283; 257/E21.623

(58) Field of Classification Search
CPC ............ H01L 29/785; H01L 29/66795; H01L 29/66545
USPC .................. 438/157, 176, 283; 257/E21.623, 257/E21.637
See application file for complete search history.

(56) References Cited

U.S. PATENT DOCUMENTS 7,605,430 B2 * 10/2009 Lee et al. ........................ 257/368
2014/0015054 A1 * 1/2014 Leobandung et al. ........ 257/351

OTHER PUBLICATIONS

Chih-Wei Kuo et al., U.S. Appl. No. 13/457,258, filed Apr. 26, 2012, for Multi-Gate Devices with Replaced-Channels and Methods for Forming the Same, 21 pages of text, 15 pages of drawings.

* cited by examiner

*Primary Examiner* — Thanhha Pham
(74) *Attorney, Agent, or Firm* — Haynes and Boone, LLP

(57) ABSTRACT

A device includes a wafer substrate including an isolation feature, at least two fin structures embedded in the isolation feature, and at least two gate stacks disposed around the two fin structures respectively. A first inter-layer dielectric (ILD) layer is disposed between the two gate stacks, with a dish-shaped recess formed therebetween, such that a bottom surface of the recess is below the top surface of the adjacent two gate stacks. A second ILD layer is disposed over the first ILD layer, including in the dish-shaped recess. The second ILD includes nitride material; the first ILD includes oxide material.

20 Claims, 9 Drawing Sheets

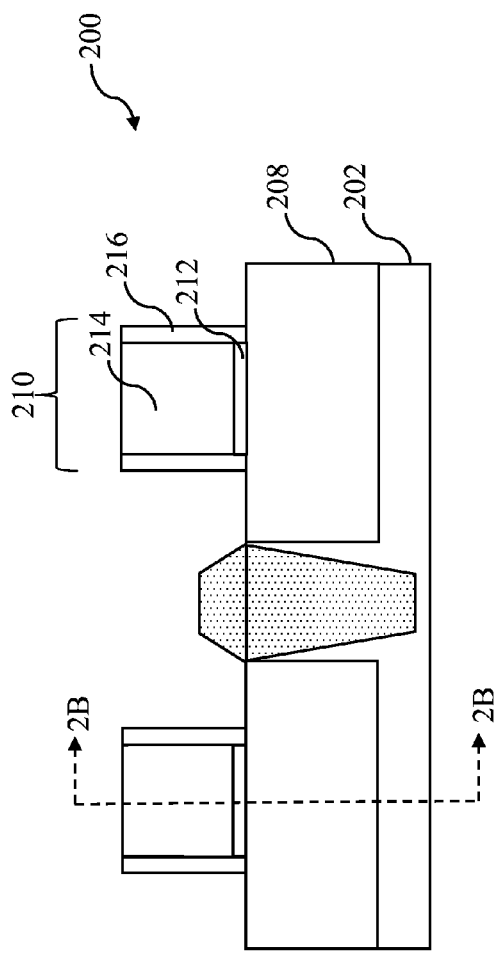
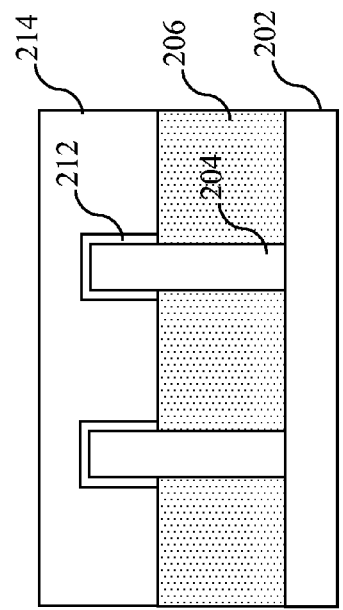
FIG. 2A
FIG. 2B

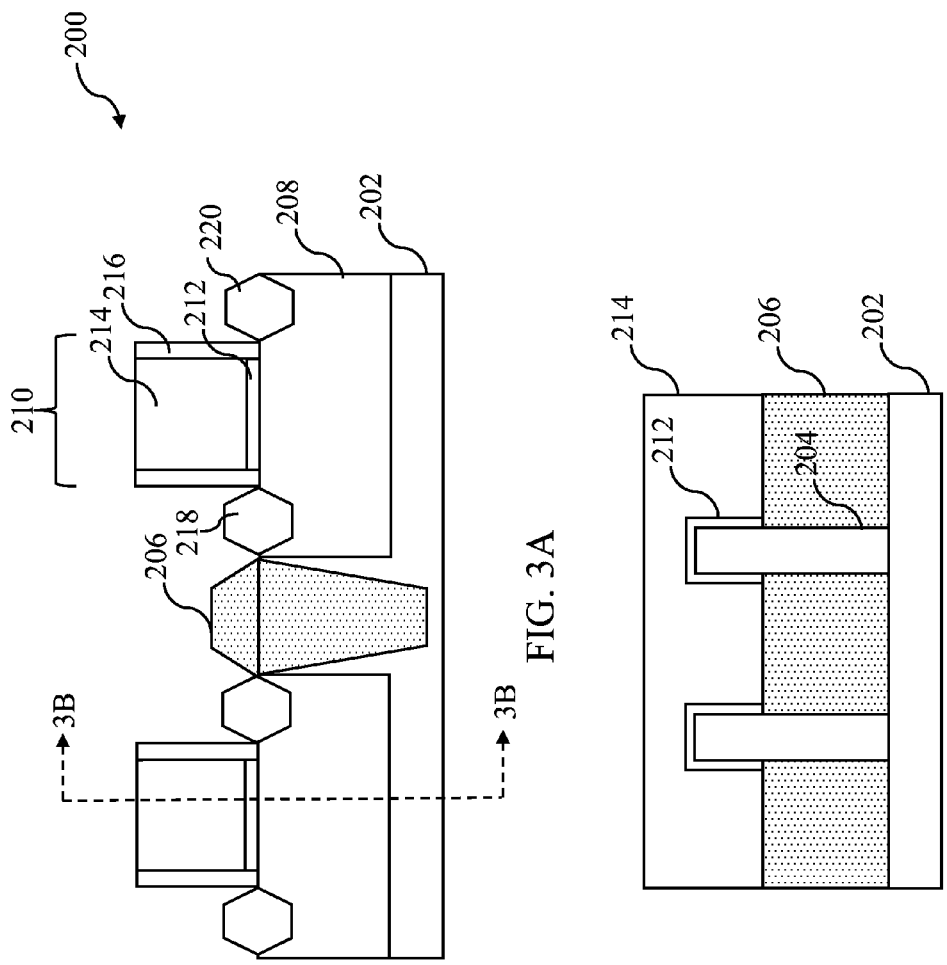

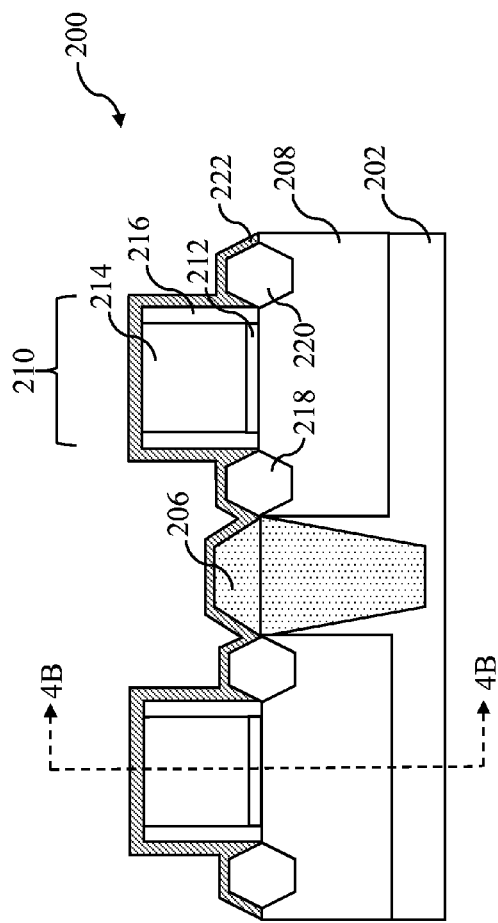
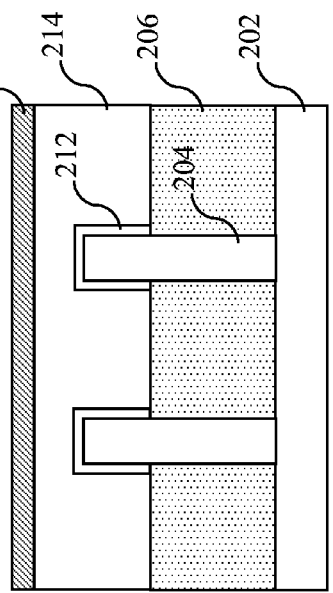
FIG. 4A
FIG. 4B

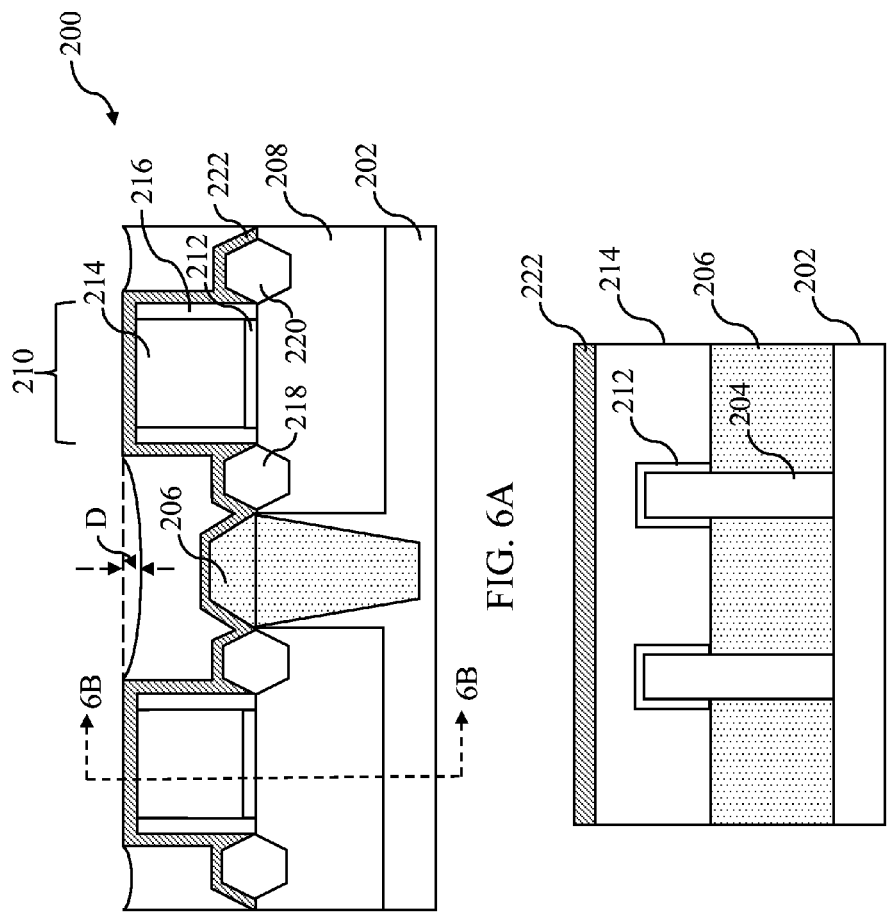

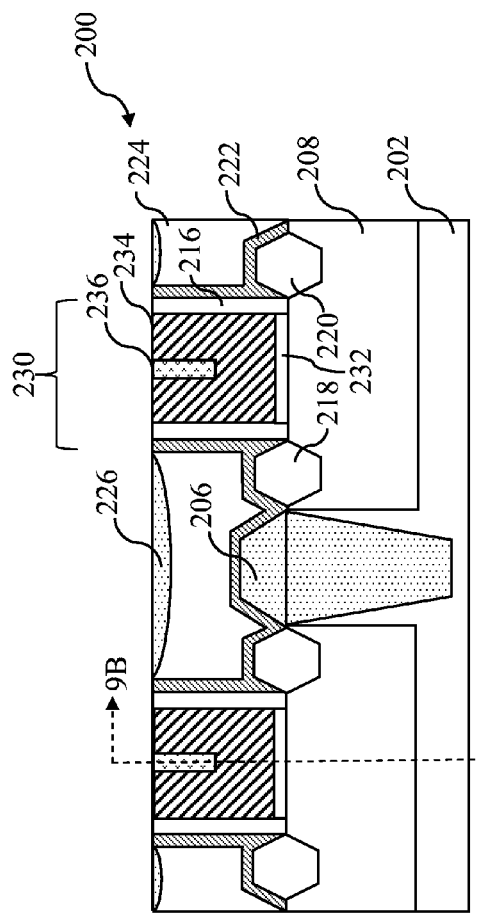
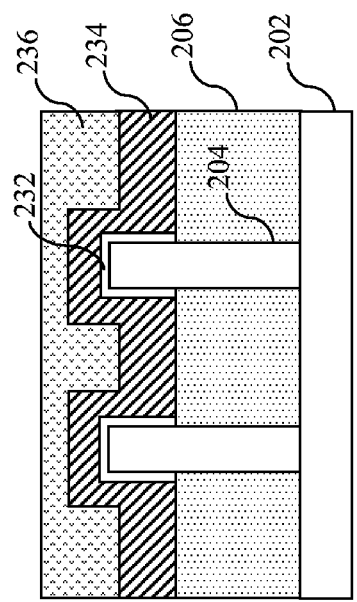
FIG. 9A
FIG. 9B

US 8,956,931 B2

METHOD FOR FABRICATING A MULTI-GATE DEVICE

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs and, for these advances to be realized, similar developments in IC processing and manufacturing are needed.

One development in the scaling down process is fabricating fin-type field effect transistors (FinFETs). It is desired to further improve the operation of fabricating the FinFETs, such as by using a high etch selectivity material as an interlayer dielectric (ILD) hard mask layer to prevent ILD loss in various fabrication processes. Accordingly, what is needed is a method for improving the fabrication and operation of the FinFET.

BRIEF DESCRIPTION OF THE DRAWINGS

The present disclosure is best understood from the following detailed description when read with accompanying figures. It is emphasized that, in accordance with the standard practice in the industry, various features are not drawn to scale and are used for illustration purpose only. In fact, the dimension of the various features may be arbitrarily increased or reduced for clarity of discussion.

FIGS. 2A-9B are diagrams of an example device fabricated using the method shown in FIG. 1.

DETAILED DESCRIPTION

Figure 1:
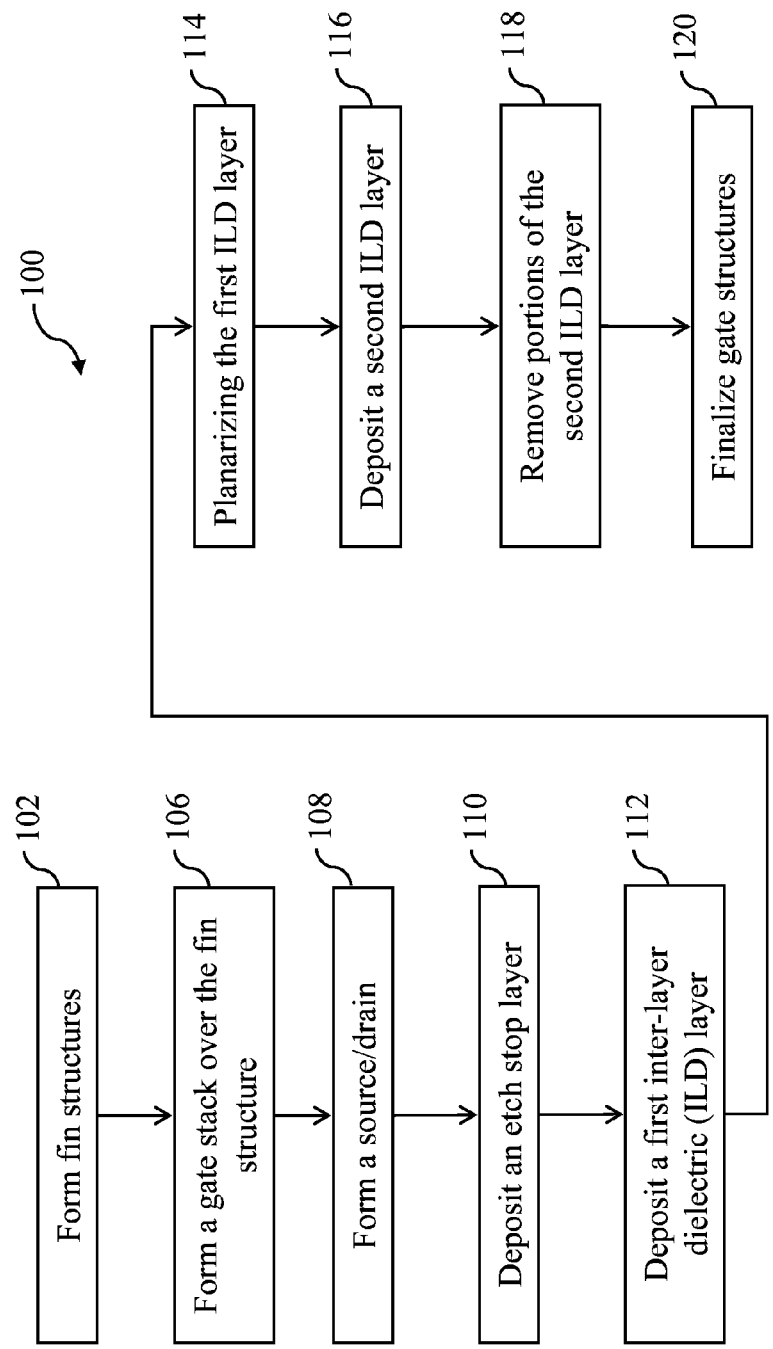
FIG. 1 is a flow chart of a method of fabricating a device for implementing one or more embodiments of the present invention.

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

It will be understood that although the terms "first" and "second" may be used herein to describe various regions, layers and/or sections, these regions, layers and/or sections should not be limited by these terms. These terms are only used to distinguish one region, layer or section from another region, layer or section. Thus, a first region, layer or section discussed below could be termed a second region, layer or section, and similarly, a second region, layer or section may be termed a first region, layer or section without departing from the teachings of the present disclosure.

Referring now to FIG. 1, a method 100 is used for fabricating a device according to one or more embodiments of the present invention. It is understood that additional steps can be provided before, during, and after the method 100, and some steps described can be replaced, eliminated, or moved around for additional embodiments of the method. A device 200 using the method 100 will concurrently be described with reference to FIGS. 2-9B. The method 100 is an example, and is not intended to limit the present disclosure beyond what is explicitly recited in the claims. In the present embodiments, a device is also referred to as a structure or a transistor. It is understood that other configurations and inclusion or omission of various items in the device 200 may be possible.

Figures 5A, 5B:
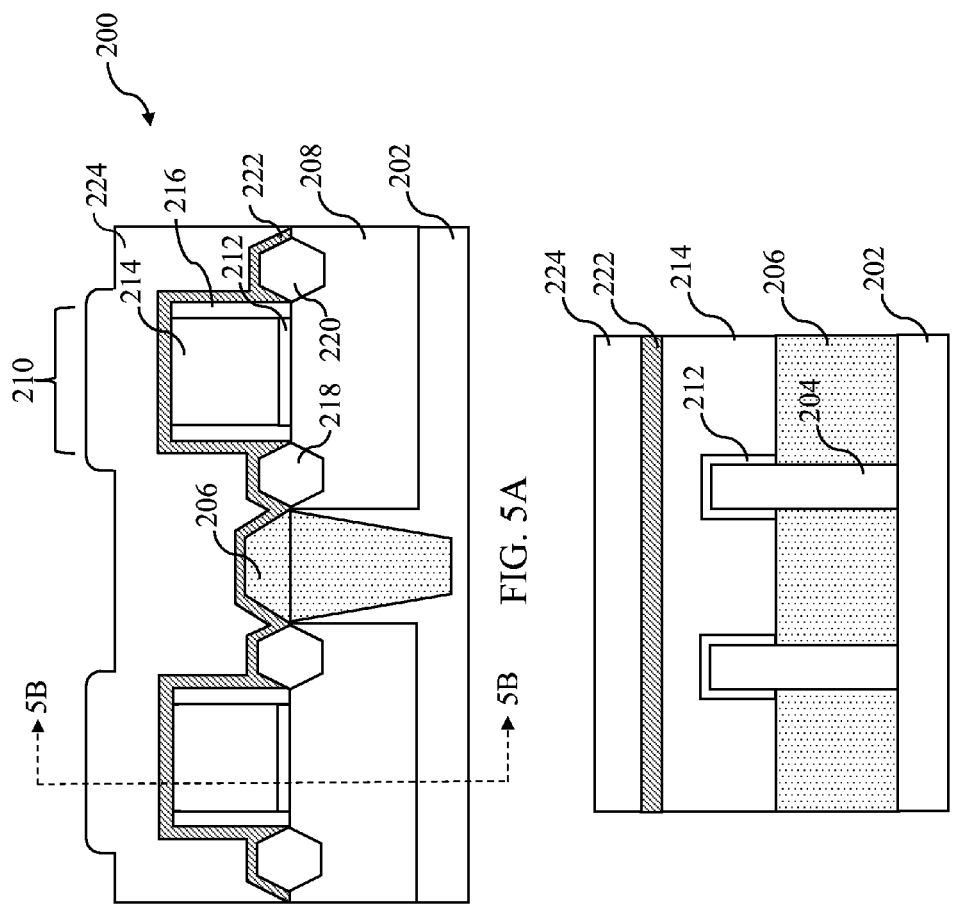

The method 100 begins at step 102 by forming a plurality of fin structures and wells on a wafer substrate. Isolation structures are also formed to isolate each of the wells and the fin structures. In the present embodiments, a fin structure is also referred to as a fin. Referring now to FIG. 2, The wells are shown in FIG. 5B, discussed below.

Referring to FIGS. 2A and 2B, fin structures 204 are formed in a wafer substrate 202, and isolation structures 206 are formed on the wafer substrate 202 to isolate each of the fin structures 204, respectively. In some embodiments, the fin structures 204 include one or more layers, and may include portions of the wafer substrate 202, such as Si. In another embodiment, the fin structure 204 may include an epitaxial (EPI) layer, such as SiGe or SiGa. Forming the fin structures 204 includes using a lithography process and an etching process. Forming the fin structures 204 may also include using an EPI growth process.

The isolation structures 206 are disposed over the wafer substrate 202 and used to isolate each of the wells. In some embodiments, the isolation structure 206 includes silicon oxide, silicon nitride, or silicon oxynitride. Other suitable materials are possible. Forming the isolation structure 206 may include using a deposition process, such as chemical vapor deposition (CVD) or physical vapor deposition (PVD). Forming the isolation structure 206 also includes using a chemical mechanical polishing (CMP) process. Forming the well may include using an implant process. Also in the present embodiment, a recess process to remove portions of the isolation structures 206 disposed on the wafer substrate 202. Performing a recess process includes using an etching process.

The method 100 (FIG. 1) proceeds to step 106 by forming a plurality of gate stacks over the fin structures and the wells.

Referring again to FIGS. 2A and 2B, gate stacks 210 are formed over a well 208 and the fin structures 204 embedded in the isolation structure 206. In the present example, the gate stacks 210 are dummy gate stacks, each including a first sacrificial layer 212, a second sacrificial layer 214, and a spacer 216. The first sacrificial layer 212 is disposed over the fin structure 24, the second sacrificial layer 214 is disposed over the first sacrificial layer 212, and the spacer 216 is disposed over sidewalls of the first sacrificial layer 212 and the second sacrificial layer 214. The first sacrificial layer 212 includes a dielectric material, such as silicon oxide or silicon nitride. In another embodiment, the second sacrificial layer 214 includes a dielectric material, such as silicon oxide or silicon nitride. The spacer 216 may include silicon oxide, silicon nitride, or silicon oxynitride. Forming the gate stacks 210 includes using a deposition process, such as a CVD or PVD process. Forming the gate stacks 210 also includes using a lithography process and an etching process.

The method 100 proceeds to step 108 by forming a source/drain around the dummy gate stack disposed on the well.

Referring now to FIGS. 3A and 3B, a source 218 and a drain 220 are formed at opposite sides of the dummy gate stacks 210 respectively. The source 218 or the drain 220 can be formed at either side of the dummy gate stack 210. The source 218 may include a P-source or N-source, and the drain 220 may include a P-drain or N-drain. In one embodiment, forming the source 218 and the drain 220 may include using an implant process. In another embodiment, forming the source 218 and the drain 220 includes forming a junction for a source/drain using a recess process and then using a source/drain EPI process. Forming the source/drain may also include using a lithography process and a cleaning process.

The method 100 proceeds to step 110 by deposing an etch stop layer over the dummy gate stack formed on the well, the source/drain around the gate stack, and the isolation structure isolating the well.

Referring now to FIGS. 4A and 4B, an etch stop layer 222 is deposited over the dummy gate stack 220 disposed over the well 208, the source 218 and the drain 220 around the dummy gate stack 220, and the isolation structure 206 separating the well 208. The etch stop layer 222 may include a nitride material, such as silicon nitride, and may be formed using a deposition process, such as CVD or PVD.

The method 100 proceeds to step 112 by depositing a first inter-layer dielectric (ILD) layer over the etch stop layer to fill the gap between the dummy gate stacks.

Referring now to FIGS. 5A and 5B, a first ILD layer 224 is deposited over the etch stop layer 222 to bury the dummy gate stacks 210 formed around the fin structure 204. In some embodiments, the first ILD layer 224 may include a soft and flowing material for better gap filling. In one embodiment, the first ILD layer 224 may include an oxide material, such as silicon oxide. Depositing the first ILD layer 224 includes using a CVD or PVD process. Depositing the first ILD layer 224 may also include using a spin-on, such as a coating process.

The method 100 proceeds to step 114 by planarizing the first ILD layer. For example, a chemical mechanical polishing (CMP) process can be used to remove portions of the first ILD layer and expose the etch stop layer disposed on top of the dummy gate stack. It is understood that in some embodiments, the first ILD layer may be sufficiently planarized, such that this step may be skipped.

Referring now to FIGS. 6A and 6B, portions of the first ILD layer 224 are removed and portions of the etch stop layer 222 disposed on top of the dummy gate stack 220 become exposed. Because of the relative softness of the first ILD layer 224, extra portion of the ILD layer 224 is removed by the CMP process, such as between the gate stacks 210. Therefore, the remained ILD layer 224 between the dummy gate stacks 210 forms a dish shape profile. In the present embodiment, the bottom of the dish is lower than top surface of the etch stop layer 222 disposed on the dummy gate stack 210. The distance between the bottom of the dish and the top surface of the gate stack 210 (including the etch stop layer 222) is designated by the letter D. In one example, the distance D ranges from approximate 30 to 300 Å for the dummy gate stack 210 having an overall height of approximately 700 Å.

The method 100 proceeds to step 116 by depositing a second ILD layer over the first ILD layer. In the present embodiments, a second ILD layer is also referred to as an ILD protection layer. The second ILD layer also fills any dishes formed in the first ILD layer.

Figure 7A:
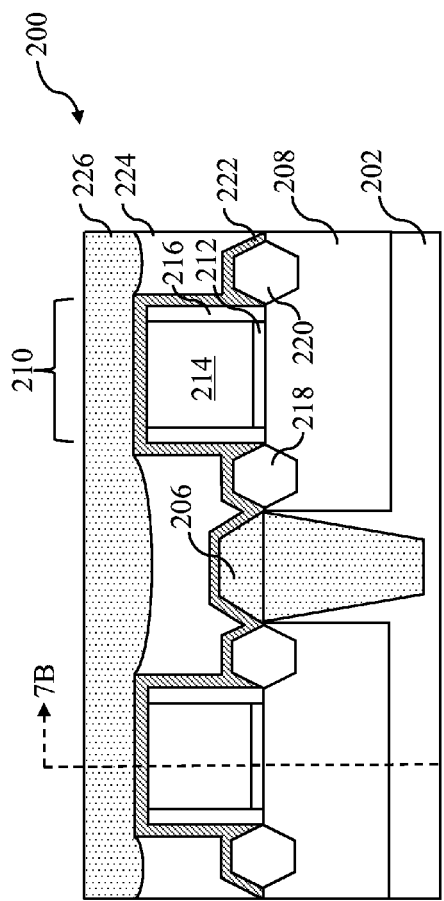
Figure 7B:
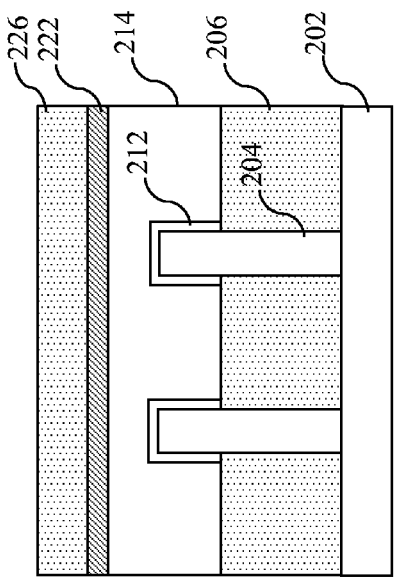

Referring now to FIGS. 7A and 7B, a second ILD layer 226 is deposited over the first ILD layer 224 and the dummy gate stack 210. The dummy gate stack 210 is buried under the second ILD layer 226. According to one or more embodiments, the second ILD layer 226 is different from the first ILD layer 224, and has a much lower etch rate compared to the first ILD layer 224. In some embodiments, the second ILD layer 226 includes a nitride related material, such as a silicon nitride or a carbon doped silicon nitride. Other suitable materials are possible.

The method 100 proceeds to step 118 by removing portions of the ILD protection layer and the etch stop layer disposed on top of the dummy gate stack, and exposing the sacrificial layer inside the dummy gate stack.

Figure 8A:
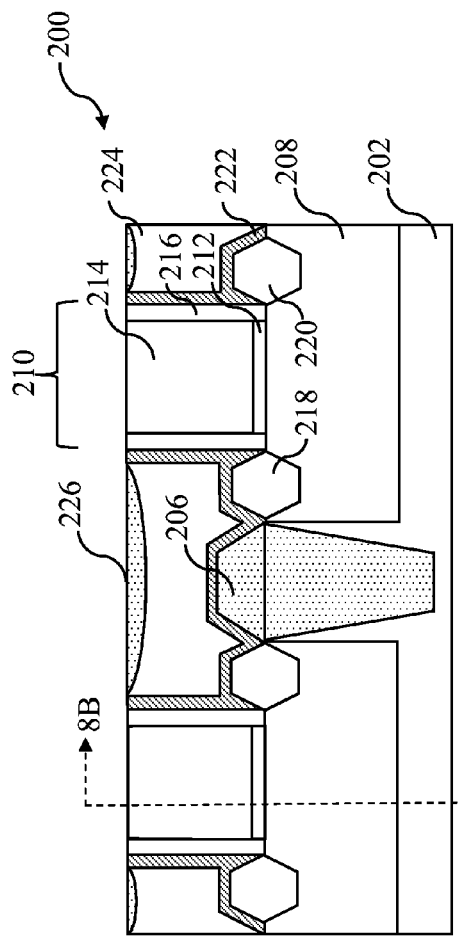
Figure 8B:
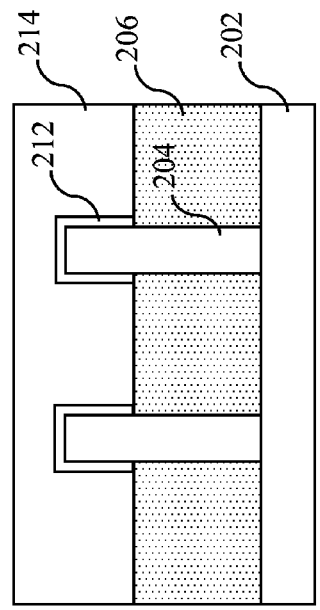

Referring now to FIGS. 8A and 8B, portions of the second ILD protection layer 226 are removed, the etch stop layer 222 disposed on top of the dummy gate stack 210 is also removed, and the second sacrificial layer 214 inside the dummy gate stack 210 is exposed to the air. The second ILD layer 226 only remains and fills the dish between the dummy gate stacks 210. In the present embodiment, a CMP process is used to remove the portions of the second ILD layer, and the second ILD layer remains in the dish due to the different properties of the second ILD layer (e.g., different etch rate during CMP), as compared to the first ILD layer.

The method 100 proceeds to step 120 by finalizing the gate structures if/as needed.

Referring now to FIGS. 9A and 9B, in the present embodiment, the gate stack 210 is a dummy gate stack. Therefore, to finalize the gate stacks, an empty space is formed inside the dummy gate stack 210 by removing the first sacrificial layer 212 and the second sacrificial layer 214 therein (FIGS. 8A and 8B), such as with an etching process. In the present embodiments, because the second ILD layer 226 is disposed on the first ILD layer 224, the loss of the ILD layer 224 is prevented while removing the first sacrificial layer 212 and the second sacrificial layer 214 inside dummy gate stack 210 using an etching process. That is, the etching process is easier to control because the second ILD layer 226 is deposited on the first ILD layer 224.

Next, a gate stack 230 is formed around the fin structure 204 embedded in the isolation structure 206. The gate stack 230 includes a first interfacial layer 232 deposited around the fin structure 204 embedded in the isolation structure 206, a second interfacial layer 234 deposited on the first interfacial layer 232, and a gate layer 236 deposited on the second interfacial layer 234. In one embodiment, the first interfacial layer 232 includes a dielectric material, such as silicon oxide and the second interfacial layer 234 includes high-k dielectric material, such as GeO. The gate layer 236 includes conducting material, such as doped polysilicon. In addition or in the alternative, the gate layer 236 may include a metal or a metal alloy, such as, Al, Ni, Cu, or combination thereof. Forming the gate stack 230 includes using a deposition process, such as CVD, PVD, sputtering, or electroplating.

In the foregoing discussion, by fabricating a device, various processes, such us a film deposition process, a lithography process, an etching process, an ion implantation process, a CMP process, and a cleaning process, are performed. In some embodiments, the film deposition process includes depositing a physical vapor deposition (PVD) process such as evaporation and DC magnetron sputtering, a plating process such as electrode-less plating or electroplating, a chemical vapor deposition (CVD) process such as atmospheric pressure CVD (APCVD), a low pressure CVD (LPCVD), a plasma enhanced CVD (PECVD), or a high density plasma CVD (HDP CVD), an ion beam deposition, spin-on coating, a metal-organic decomposition (MOD), an atomic layer deposition (ALD) process and/or other suitable methods.

In some embodiments, the lithography process may include coating a resist film on a wafer substrate, exposing the resist film deposited on the wafer substrate by an optical lithography tool or an electron beam writer, and developing the exposed resist film to form a resist pattern for an ion implantation process or an etching process. The coating the resist film on the wafer substrate includes performing a dehydration process before applying the resist film on the wafer substrate, which can enhance an adhesion of the resist film to the wafer substrate. The dehydration process may include baking the substrate at a high temperature for a duration of time, or applying a chemical such as hexamethyldisilizane (HMDS) to the substrate. The coating the resist film on the wafer substrate may include a soft bake (SB). The exposing the resist film deposited on the wafer substrate includes using a mask. The mask may be a binary mask (BIM), a super binary mask (SBIM), or a phase shift mask (PSM), which includes an alternative phase shift mask (alt. PSM) or an attenuated phase shift mask (att. PSM). The optical lithography tool may include an I-line, a deep ultraviolet (DUV), or an extreme ultraviolet (EUV) tool. The developing the exposed resist film may include a post exposure bake (PEB), a post develop bake (PDB) process, or a combination thereof.

In some embodiments, the etching process may include a dry (plasma) etching, a wet etching, and/or other etching methods. For example, a dry etching process may implement an oxygen-containing gas, a fluorine-containing gas (e.g., $CF_4$, $SF_6$, $CH_2F_2$, $CHF_3$, and/or $C_2F_6$), a chlorine-containing gas (e.g., $Cl_2$, $CHCl_3$, $CCl_4$, and/or $BCl_3$), a bromine-containing gas (e.g., $HBr$ and/or $CHBR_3$), an iodine-containing gas, other suitable gases and/or plasmas, and/or combinations thereof.

Thus, the present disclosure describes a device. The device includes a wafer substrate including an isolation feature, at least two fin structures embedded in the isolation feature, at least two gate stacks disposed around the two fin structures respectively, a first inter-layer dielectric (ILD) layer disposed between the two gate stacks, and a second ILD layer disposed over the first ILD layer, wherein the second ILD layer prevents loss of the first ILD. The device further includes an etch stop layer between the gate stack and the first ILD layer. The second ILD includes a dish shape profile. The second ILD is different from the first ILD layer. The second ILD includes nitride material. The first ILD includes oxide material. The gate stacks includes a first interfacial layer around the fin structure, a second interfacial layer disposed over the first interfacial layer, a gate layer disposed over the second interfacial layer, and a spacer disposed on sidewalls of the first and second interfacial layers and the gate layer. The first interfacial layer includes silicon oxide. The second interfacial layer includes high-k dielectric material. The gate layer includes polysilicon, a metal or a metal alloy.

In some embodiments, a method of fabricating a device is described. The method includes forming a fin structure and an isolation structure on a wafer substrate, wherein the fin structure embedded in the isolation structure, forming a dummy gate stack around the fin structure, where in the dummy gate stack includes a first sacrificial layer disposed over the fin structure, a second sacrificial layer disposed over the first sacrificial layer, and a spacer disposed on sidewalls of the first and second sacrificial layers, depositing an etch stop layer over the dummy gate stack, depositing a first inter-layer dielectric (ILD) layer over the etch stop layer, removing portions of the first ILD layer to expose the etch stop layer disposed on top of the dummy gate stack, depositing a second ILD layer over the first ILD layer, wherein the second ILD layer protects the first ILD layer, removing portions of the second ILD and the etch stop layer disposed on top of the dummy gate stack, removing the first and second sacrificial layers inside the dummy gate stack to form an empty space inside the dummy gate stack, and forming a gate stack by filing the empty space with a first interfacial layer around the fin structure, a second interfacial layer over the first interfacial layer, and a gate layer over the second interfacial layer. The method further includes performing a recess process to remove portions of the isolation structure. The method further includes forming a source/drain around the dummy gate stack. Removing portions of the first ILD layer includes using a recess process to form a dish shape profile of the first ILD layer. Removing portions of the second ILD and the etch stop layer includes exposing the second sacrificial layer inside the dummy gate stack to the air.

In other embodiments, a method of fabricating a device is presented. The method includes forming a fin structure and an isolation structure on a wafer substrate, wherein the fin structure embedded in the isolation structure, performing a recess process to remove portions of the isolation structure, forming a dummy gate stack around the fin structure, where in the dummy gate stack includes a first sacrificial layer disposed over the fin structure, a second sacrificial layer disposed over the first sacrificial layer, and a spacer disposed on sidewalls of the first and second sacrificial layers, forming a source/drain around the dummy gate stack, depositing an etch stop layer over the dummy gate stack, depositing an first inter-layer dielectric (ILD) layer over the etch stop layer, removing portions of the first ILD layer to expose the etch stop layer disposed on top of the dummy gate stack and form a dish shape profile of the first ILD layer, depositing a second ILD layer over the first ILD layer, wherein a dish shaped second ILD layer covers the first ILD layer, removing portions of the second ILD and the etch stop layer disposed on top of the dummy gate stack so that the second sacrificial layer inside the dummy gate stack is exposed to the air, removing the second and first sacrificial layers inside the dummy gate stack to form an empty space inside the dummy gate stack, and forming a gate stack by filing the empty space with a first interfacial layer around the fin structure, a second interfacial layer over the first interfacial layer, and a gate layer over the second interfacial layer. Removing portion of the first ILD layer includes using a chemical mechanical polishing (CMP) process. Removing portion of the first ILD layer further includes using a recess process. Deposing the second ILD layer includes depositing a silicon nitride layer. Removing portions of the second ILD and the etch stop layer includes using a CMP process.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of fabricating a semiconductor device, the method comprising:
   forming a fin structure and an isolation structure on a wafer substrate, wherein the fin structure is embedded in the isolation structure;
   forming two gate stacks around the fin structure;
   depositing a first inter-layer dielectric (ILD) layer over the two gate stacks;
   removing portions of the first ILD layer, wherein a recess is formed between the two gate stacks;
   depositing a second ILD layer over the first ILD layer, including in the recess; and
   removing portions of the second ILD, leaving the second ILD layer in the recess.

2. The method of claim 1, wherein the two gate stacks are dummy gate stacks, the method further comprising:
   depositing an etch stop layer over the two gate stacks;
   forming the dummy gate stacks around the fin structure, wherein the dummy gate stacks include a first sacrificial layer disposed over the fin structure, a second sacrificial layer disposed over the first sacrificial layer, and a spacer disposed on sidewalls of the first and second sacrificial layers;
   removing the first and second sacrificial layers inside the dummy gate stacks to form an empty spaces inside each dummy gate stack; and
   forming another gate stack by filing the empty space with a first interfacial layer around the fin structure, a second interfacial layer over the first interfacial layer, and a gate layer over the second interfacial layer.

3. The method of claim 1, wherein the steps of removing portions of the first and second ILD layers utilizes chemical mechanical polishing (CMP).

4. The method of claim 1, wherein a bottom surface of the recess is below a top surface of the two gate stacks by at least 50 Å.

5. A method of fabricating a semiconductor device, the method comprising:
   forming a fin structure and an isolation structure on a wafer substrate, wherein the fin structure embedded in the isolation structure;
   performing a recess process to remove portions of the isolation structure;
   forming a dummy gate stack around the fin structure, where in the dummy gate stack includes a first sacrificial layer disposed over the fin structure, a second sacrificial layer disposed over the first sacrificial layer, and a spacer disposed on sidewalls of the first and second sacrificial layers;
   forming a source/drain around the dummy gate stack;
   depositing an etch stop layer over the dummy gate stack;
   depositing an first inter-layer dielectric (ILD) layer over the etch stop layer;
   removing portions of the first ILD layer to expose the etch stop layer disposed on top of the dummy gate stack and form a dish shape profile of the first ILD layer;
   depositing a second ILD layer over the first ILD layer, wherein a dish shaped second ILD layer covers the first ILD layer;
   removing portions of the second ILD and the etch stop layer disposed on top of the dummy gate stack so that the second sacrificial layer inside the dummy gate stack is exposed to the air;
   removing the second and first sacrificial layers inside the dummy gate stack to form an empty space inside the dummy gate stack; and
   forming a gate stack by filing the empty space with a first interfacial layer around the fin structure, a second interfacial layer over the first interfacial layer, and a gate layer over the second interfacial layer.

6. The method of claim 5, wherein removing portion of the first ILD includes using a chemical mechanical polishing (CMP) process.

7. The method of claim 6, further comprising using a recess process.

8. The method of claim 5, wherein deposing the second ILD layer includes depositing a silicon nitride layer.

9. The method of claim 5, wherein removing portions of the second ILD and the etch stop layer includes using a CMP process.

10. A method for making a semiconductor device, comprising:
    forming at least two fin structures in an isolation feature of a substrate;
    forming at least two gate stacks around the two fin structures respectively;
    forming a first inter-layer dielectric (ILD) layer between the two gate stacks, wherein a portion of the first ILD layer has a top surface lower than top surfaces of the two gate stacks, thereby forming a recess with a dish-shaped profile, wherein forming the first ILD layer between the two gate stacks includes depositing the first ILD over the two gate stacks and subsequently removing portions of the first ILD layer to form the recess with the dish shaped profile; and
    forming a second ILD layer over the first ILD layer and in the recess, where the second ILD layer has a top surface that is approximately the same as the top surfaces of the two gate stacks.

11. The method of claim 10, further comprising forming an etch stop layer between the gate stack and the first ILD layer.

12. The method of claim 10, wherein the second ILD is different from the first ILD layer.

13. The method of claim 12, wherein the second ILD includes a nitride material and the first ILD includes an oxide material.

14. The method of claim 12, wherein the second ILD has a different etch rate than the first ILD layer.

15. The method of claim 10, wherein one of the two gate stack includes a first interfacial layer around the fin structure, a second interfacial layer disposed over the first interfacial layer, a gate layer disposed over the second interfacial layer, and a spacer disposed on sidewalls of the first and second interfacial layers and the gate layer.

16. The method of claim 15, further comprising removing portions of the second ILD to expose the second interfacial layer.

17. The method of claim 16, wherein the first interfacial layer includes silicon oxide.

18. The method of claim 16, wherein the second interfacial layer includes a high-k dielectric material.

19. The method of claim 16, wherein the gate layer includes polysilicon, a metal or a metal alloy.

20. The method of claim 10, further comprising forming an etch stop layer over the two gate stacks; and
    wherein removing portions of the first ILD layer to form the recess includes removing portions of the first ILD layer over the two gate stacks to expose the two gate stacks.

* * * * *